(12) United States Patent
Dabral et al.

(10) Patent No.: US 12,119,304 B2
(45) Date of Patent: Oct. 15, 2024

(54) VERY FINE PITCH AND WIRING DENSITY ORGANIC SIDE BY SIDE CHIPLET INTEGRATION

(71) Applicant: Apple Inc., Cupertino, CA (US)

(72) Inventors: Sanjay Dabral, Cupertino, CA (US);
Zhitao Cao, Campbell, CA (US);
Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/321,080

(22) Filed: May 14, 2021

(65) Prior Publication Data

US 2022/0102280 A1  Mar. 31, 2022

Related U.S. Application Data

(60) Provisional application No. 63/083,741, filed on Sep. 25, 2020.

(51) Int. Cl.
| | | |
|---|---|---|
| *H01L 23/538* | (2006.01) | |
| *H01L 21/56* | (2006.01) | |
| *H01L 21/66* | (2006.01) | |
| *H01L 23/31* | (2006.01) | |
| *H01L 23/532* | (2006.01) | |
| *H01L 25/065* | (2023.01) | |

(52) U.S. Cl.
CPC ......... *H01L 23/5384* (2013.01); *H01L 21/56* (2013.01); *H01L 22/12* (2013.01); *H01L 23/31* (2013.01); *H01L 23/53228* (2013.01); *H01L 23/5386* (2013.01); *H01L 25/0655* (2013.01)

(58) Field of Classification Search
CPC . H01L 23/5384; H01L 21/56; H01L 23/5386; H01L 25/0655; H01L 22/12
USPC .......................................................... 257/741
See application file for complete search history.

(56) References Cited

U.S. PATENT DOCUMENTS

| | | |
|---|---|---|
| 9,418,877 B2 | 8/2016 | Gu et al. |
| 9,543,170 B2 | 1/2017 | Yu et al. |
| 9,576,919 B2 | 2/2017 | Scanlan et al. |
| 9,583,462 B2 | 2/2017 | Lee et al. |
| 11,158,607 B2 | 10/2021 | Dabral et al. |
| 2011/0049675 A1 | 3/2011 | Nagai et al. |

(Continued)

FOREIGN PATENT DOCUMENTS

TW 202021015 A 6/2020

OTHER PUBLICATIONS

Michael Thompson "Introduction to Flexible Electronics I—PowerPoint PPT Presentation." MS&E Cornell University Life ERC Discussions, SlideServe, Recieved from <https://www.slideserve.com/seth/introduction-to-flexible-electronics-i>, Feb. 24, 2007, 27 pages.

(Continued)

*Primary Examiner* — Quoc D Hoang
(74) *Attorney, Agent, or Firm* — Aikin & Gallant, LLP

(57) ABSTRACT

Structures and methods of forming fine die-to-die interconnect routing are described. In an embodiment, a package includes a package-level RDL than spans across a die set and includes a plurality of die-to-die interconnects connecting contact pads between each die. In an embodiment, the plurality of die-to-die interconnects is embedded within one or more photoimageable organic dielectric layers.

28 Claims, 10 Drawing Sheets

(56) References Cited

U.S. PATENT DOCUMENTS

| | | | |
|---|---|---|---|
| 2013/0168860 A1* | 7/2013 | Karikalan | H01L 23/538 |
| | | | 257/E23.161 |
| 2016/0379959 A1 | 12/2016 | We et al. | |
| 2018/0061767 A1 | 3/2018 | Chiang et al. | |
| 2018/0102470 A1 | 4/2018 | Das et al. | |
| 2018/0294230 A1 | 10/2018 | Dabral et al. | |
| 2019/0304892 A1 | 10/2019 | Zhang et al. | |
| 2020/0043853 A1* | 2/2020 | Kim | H01L 24/81 |
| 2020/0105635 A1 | 4/2020 | Yu et al. | |
| 2020/0144186 A1 | 5/2020 | Thomas et al. | |
| 2020/0176419 A1 | 6/2020 | Dabral et al. | |
| 2021/0091032 A1* | 3/2021 | Bonam | H01L 25/042 |
| 2021/0366863 A1* | 11/2021 | Wu | H01L 25/18 |
| 2021/0375768 A1* | 12/2021 | Tsou | H01L 23/49838 |
| 2022/0013504 A1 | 1/2022 | Dabral et al. | |

OTHER PUBLICATIONS

PCT/US2021/048174, "PCT Notification Concerning Transmittal of International Preliminary Report on Patentability (Chapter I of the Patent Cooperation Treaty)", mailed Apr. 6, 2023, 9 pages.

\* cited by examiner

VERY FINE PITCH AND WIRING DENSITY ORGANIC SIDE BY SIDE CHIPLET INTEGRATION

RELATED APPLICATIONS

This application claims the benefit of priority of U.S. Provisional Application No. 63/083,741 filed Sep. 25, 2020, which is incorporated herein by reference.

BACKGROUND

Field

Embodiments described herein relate to integrated circuit (IC) manufacture and packaging, and the interconnection of multiple dies.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, multiple-die packaging solutions such as multi-chip module (MCM), multi-chip integrated fan-out, system in package (SiP) and package on package (PoP) are moving toward more complex arrangements with finer routing requirements to connect multiple dies efficiently.

SUMMARY

Multi-die packaging structures and methods of forming fine die-to-die interconnect routing are described. Fine die-to-die interconnections in accordance with embodiments may include both fine pad pitch and wiring density. In an embodiment, a package includes a die set encapsulated in a molding compound layer, a package-level redistribution layer (RDL) spanning across the die set and the molding compound layer and on and in electrical connection with the die set. Each die in the die set may include a die-level back end of the line (BEOL) build-up structure including a plurality of contact pads, and the package-level RDL includes a plurality of die-to-die interconnects connecting the plurality of contact pads between each die. In an embodiment, the plurality of die-to-die interconnects is embedded within one or more photoimageable organic dielectric layers. For example, photoimageable organic dielectric layers may facilitate conventional lithography techniques or adaptive writing and adaptive patterning to facilitate a higher contact pad density, as well as wiring density of the die-to-die interconnects. Furthermore, damascene processing can be included at the package-level RDL to increase wiring density and the number of wiring layers. In an embodiment, the package-level RDL includes copper damascene wiring and die-to-die interconnects formed in photoimageable polymer dielectric layers. Thus, in addition to using damascene processing at die-level BEOL build-up structure, damascene BEOL-type processing can also be extended to the package-level RDL.

In an embodiment a package includes a die set encapsulated in a molding compound layer, and an inorganic barrier layer over the die set, and between the die set and the molding compound layer. A package-level redistribution layer (RDL) spans across the molding compound layer and on and in electrical connection with the die set. The package-level RDL may additionally span across the inorganic barrier layer laterally between dies in the die set. The inorganic barrier layer may function as a stress barrier from the molding compound layer to a plurality of die-to-die interconnects in the package-level RDL connecting contact pads between each die. The inorganic barrier layer may also shield wiring from mold pits (e.g. voids) in the molding compound layer.

The die-to-die interconnect structures and processing sequences can be used to both connect discrete dies or chiplets, or die areas with a same silicon layer (i.e. on the same wafer). In an embodiment, a chip includes a die area set formed in a same semiconductor layer, and a BEOL build-up structure formed over the die area set. The BEOL build-up structure may include a plurality of contact pads, and a chip-level RDL may span across the BEOL build-up structure and over the underlying die area set, with the chip-level RDL including a plurality of die area-to-die area interconnects connecting the plurality of contact pads between each die area. Thus, in addition to using damascene processing at die-level BEOL build-up structure, damascene BEOL-type processing can also be extended to the chip-level RDL to support a finer pad pitch, and higher wiring density for both side-by-side wiring density and multiple layer wiring density.

DETAILED DESCRIPTION

Figure 1:
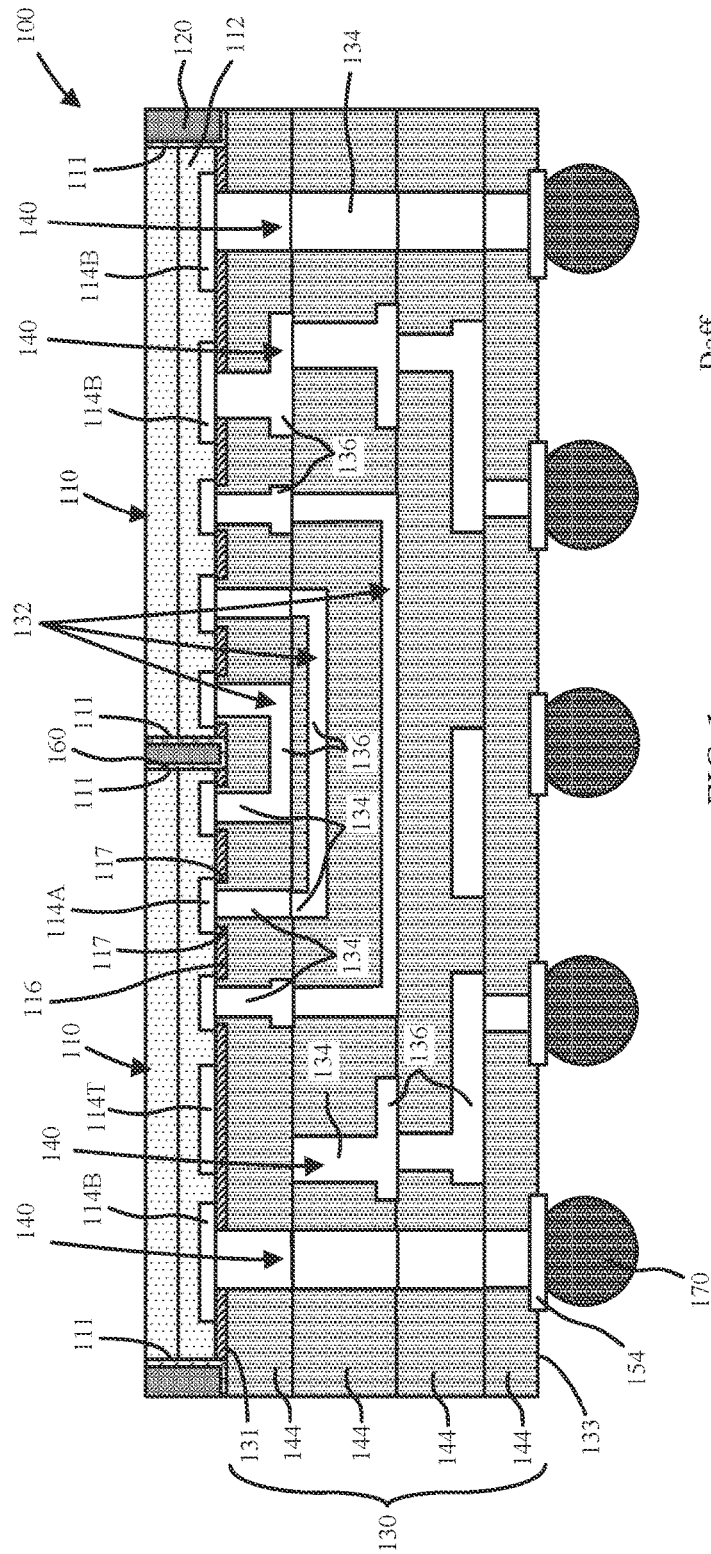
FIG. 1 is a cross-sectional side view illustration of a package including a package-level redistribution layer with a plurality of die-to-die interconnects in accordance with an embodiment.

Embodiments describe multi-die packaging structures and methods of forming fine die-to-die interconnect routing. In accordance with embodiments, specific complementary packaging techniques may be integrated together in order to achieve finer wiring density and die contact pad density for die-to-die interconnects than is commonly available with flip chip die attach or traditional redistribution layer (RDL) based die first or die last interconnect packaging techniques. For example, die contact pad pitch of less than 10 µm, or more specifically less than 5 µm, and line width and spacing each less than 1 µm may be achieved using combinations of precise pick and place equipment, face down die placement, use of photoimageable organic dielectric layers in the package-level RDL to support adaptive writing, and damascene interconnects. Additionally, deposition of an inorganic barrier layer liner over the die set prior to molding may provide a stress mitigation structure that can help support fine wiring structures. In accordance with embodiments, the packaging sequences may be scaled to support high bandwidth applications with extremely high input/output (IO).

The packaging sequences in accordance with embodiments may further mitigate several common barriers to reduction of wiring line width/spacing and pitch. In order to illustrate such common barriers to densification reference is made to a conventional die packaging sequence in which a die set is first placed onto a carrier substrate face up, with each die including via 0's prefabricated on the die contact pads. For example, via 0 may be a copper micro pillar formed on the integrated circuit die pad to which the first redistribution layer (RDL) is formed on. Via 0's in a die face up sequence may compensate for die thickness variation, or die-to-die thickness variation, for example. The die set is then molded, followed by grinding of the overmold layer to expose the via 0's, and redistribution layer (RDL) formation. It has been observed that such a fabrication sequence however may include at least two significant limiting factors on reduction of die contact pad pitch, which can also affect overall wiring line width/spacing and pitch. Thus, contact pad density can also affect wiring density connected to the contact pads. A first contributing factor may be die placement accuracy of traditional pick and place tools, which may have a die placement accuracy of +/−6 µm, for example. A second contributing factor may be related to via 0 diameter, which may be 8-12 µm, for example. In such a traditional fabrication sequence die contact pad pitch may be as low as 19-25 µm, for example.

In accordance with embodiments, selection of a more accurate pick and place tool can be a first basis for reduction of die contact pad pitch, and increasing contact pad density. For example, it is possible to achieve die placement accuracy of not more than +/−2 µm, for example, with a more accurate pick and place tool. Finer pick and place accuracy may allow for loosening of pad pitch requirements, allowing a narrower die contact pad pitch as low as 12-16 µm, for example, at a potential cost of additional pick and place time.

In accordance with embodiments, another basis for reduction of die contact pad pitch, and increasing contact pad density, can be implementation of adaptive writing. In such a sequence, die placement is measured after pick and place. The measured location of the die set is then compared to a baseline location, and a modified wiring pattern is determined. While certain capital and time costs may be associated with implementing such an adaptive writing technique, this may be compensated some by using adaptive lithography, which is a subpart of adaptive wiring. In such a technique, a photoimageable polymer is used as the RDL dielectric layer(s). The photoimageable polymer locations that are exposed and developed become permanent dielectric layer area, and the undeveloped areas removed by dissolving. Wiring layers can then be formed, such as with electroplating, optionally followed by planarization. Such a technique can avoid etching operations and associated chemicals. Adaptive writing with adaptive lithography can also help achieve a narrower die contact pad pitch as low as 12-16 µm, for example. Such adaptive writing may compensate for die placement accuracy in its own right, independent of the pick and place tool.

Furthermore, damascene processing conditions can further contribute to densification of wiring line width/spacing and pitch. In particular, planarization operations during single and dual damascene fabrication sequences can facilitate wire densification using multiple metal layers where thickness and density is not limited by the topography of underlying thin films.

In accordance with embodiments, yet another basis for reduction of die contact pad pitch, and increasing pad density, can be removal of via 0. This may be achieved using face down placement of the dies rather than face up. It has been observed via 0 diameter is commonly large, such as 8-12 µm, for example. This size may provide tolerance for making electrical contact during RDL formation, and pick and place misalignment. Furthermore, in order to accommodate an 8-12 µm diameter via 0, the underlying die contact pads are therefore necessarily larger in order to accommodate tolerances for locating via 0. Thus, the via 0's associated with face up pick and place techniques indirectly affect ability to reduce contact pad size and pitch. Accordingly, in conformity with the above examples, a conventional via 0 diameter of 8-12 µm can be replaced with a 2-3 µm via contact using a face down placement fabrication technique. When removal of via 0 is combined with a more accurate pick and place tool, even narrower die contact pad pitch as low as 8-10 µm, for example, can be achieved. Further densification, of die contact pad pitches below 5 µm, such as 3-5 µm, for example, can be achieved with further combination with adaptive writing with adaptive lithography.

It is to be appreciated that the above sizes and ranges for die contact pad pitch, and line width and spacing are provided for illustrational purposes, and embodiments are not so limited. Thus, the provided sizes and ranges are included to illustrate an effect of the processing techniques, particularly when combined.

As will become apparent in the following description, the combinations of processing techniques can facilitate reduction of die contact pad size and pitch and densification of wiring line width/spacing and pitch to achieve an effect that is greater than the sum of the effects of each processing technique applied separately. For example, active pick and place techniques with more accuracy can affect die contact pad x-pitch, with damascene processing affecting side-by-side and multiple layer wiring density. Face down placement fabrication sequence eliminates the need for via 0, and can thus reduce contact pad size and pitch by removing the additional via layer. Furthermore, adaptive writing, including adaptive lithography, can reduce pad size to pad opening ratios as will be described in further detail with regard to FIG. 3. A face down placement technique also incidentally allows the formation of an inorganic barrier layer liner over the die set, which can reduce the transfer of stress from the molding compound layer used to encapsulate the die set to the overlying die-to-die wiring. The inorganic barrier layer may also shield wiring from being formed over an uneven topography due to mold pits (e.g. voids) in the molding compound layer. Thus, this indirectly contributes to the ability to further reduce contact pad size and pitch, and reduce wiring line width/spacing and pitch, thereby increasing density, by providing mechanical support and robustness to the package.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1, a cross-sectional side view illustration is provided of a package 100 including a package-level RDL 130 with a plurality of die-to-die interconnects 132 in accordance with an embodiment. As shown, the package 100 may include a die set encapsulated in a molding compound layer 120 and a package-level RDL 130 spanning across the die set and the molding compound layer 120 and on and in electrical connection with the die set. Each die 110 in the die set includes a die-level back end of the line (BEOL) build-up structure 112 including a plurality of contact pads 114A, 114B, 114T. As shown, the package-level RDL includes a plurality of die-to-die interconnects 132 connecting the plurality of contact pads 114A between each die 110. In an embodiment, the plurality of die-to-die interconnects 132 are embedded within one or more photo-imageable organic dielectric layers 144. The die-to-die interconnects 132 may optionally be formed using a damascene process, including single damascene and dual damascene and include vias 134 formed directly on the plurality of contact pads 114A for each die 110 in the die set. It is to be appreciated that the dimensions of the package-level RDL 130 of FIG. 1 are not necessarily drawn to scale relative to the dies 110 in order to illustrate the particular wiring configurations.

As shown in FIG. 1, the package-level RDL 130 can also be formed on die contact pads 114B, 114T not used for die-to-die connection. Thus, the package-level RDL 130 can include intra-die interconnections 140, for example for routing to landing pads 154, such as underbump metallurgy (UBM) pads, on a bottom side 133 of the package 100. The intra-die interconnections 140 may include combinations of vias 134 and interconnect lines 136 for fan-in or fan-out routing, as well as stacked vias 134, for example. Solder bumps 170 or other electrical connections can be placed on the landing pads 154 for electrical connection to another components, such as a wiring board, interposer, another package, etc. Similarly, the intra-die interconnections can be formed using damascene processes including single damascene and dual damascene.

Also shown in FIG. 1, includes die contact pads 114T (in addition to 114B), which can be used for testing for example. As their purpose can be primarily for testing, the contact pads 114T may optionally be unconnected when forming the package-level RDL 130 such that the package-level RDL 130 is not electrically connected to the test contact pads 114T. In accordance with embodiments contact pads 114A used for die-to-die interconnects may be smaller and have a finer pitch than the contacts pads 114B used for intra-die connection, or contact pads 114T used for test pads. As such, contact pads 114A may not be directly probed/tested. In an embodiment, the contact pads 114A used for die-to-die interconnects 132 have a pitch less than 25 μm, or even more particularly less than 5 μm, while the contact pads 114T used for testing may have a minimum pad pitch of 50-100 μm depending upon the case. Contact pads 114B used for intra-die interconnects 140 may have densities, size and pitch of either contact pads 114A or contact pads 114T.

The die sets in accordance with embodiments may include two or more dies 110, which can be similar or dissimilar dies. In an embodiment, the dies 110 may include split logic. For example, one IP logic block (e.g. central processing unit, CPU) may be in one die, with another IP logic block (graphics processing unit, GPU) in another die. In another example, one IP block (e.g. higher performance block, with optional smaller processing node, such as smaller transistor size) is in one die (e.g. CPU, GPU), with another IP block (e.g. lower performance block, with optional larger processing node, such as larger transistor size) in the second die (e.g. RF, memory). Other suitable IP blocks that can be portioned include memory-application processor (MEM/AP), voltage regulation, passives integration, etc. Die splitting, or partitioning may also result in smaller die sizes, and be referred to as chiplets.

Still referring to FIG. 1, as shown, the lowest metal layer in the RDL 130 includes a first dual damascene die-to-die interconnect 132 that includes a first damascene via 134 directly on a first contact pad 114A of a first die 110, a second damascene via 134 directly on a second contact pad 114A of a second die 110, and a damascene interconnect line 136 connecting the first damascene via 134 and the second damascene via 134. In such a dual damascene structure the first damascene via, the second damascene via and the damascene interconnect line are a continuous metal layer. Vias 134 in accordance with embodiments may be the same height. In particular, damascene vias 134 used to connect to a same damascene interconnect line 136 may be the same height. In some embodiments, both dual damascene vias 134 and single damascene vias 134 may be directly on the contact pads 114A of the dies 110, for example, to accommodate multiple metal layer damascene die-to-die interconnect lines 136.

The die-to-die interconnects 132 may be formed in multiple metal layers within the package-level RDL 130, and may be formed on either vias 134 or interconnect lines 136 of lower metal layers. In an embodiment, an upper metal layer dual damascene die-to-die interconnect includes a first upper metal layer damascene via 134 directly on a first lower metal layer via 134 (or interconnect line 136 not used for die-to-die connection), a second upper metal layer damascene via 134 directly on a second lower metal layer via 134 (or interconnect line 136 not used for die-to-die connection), and an upper metal layer damascene interconnect line 136 connecting the first upper metal layer damascene via and the second upper metal layer damascene via. In such a dual damascene structure the first upper metal layer damascene via, the second upper metal layer damascene via and the upper metal layer damascene interconnect line are a continuous metal layer. Although only two metal layers are shown, more metal layers may be added.

As previously described, the package 100 can be fabricated using a face down die placement sequence followed by encapsulation with a molding compound layer 120, and then formation of the package-level RDL 130, such that a top side 131 of the package-level RDL 130 is formed directly on the faces of the dies 110 including contact pads 114A, 114B, and passivation layer 116 that includes openings 117 exposing the underlying contact pads 114A, 114B (i.e. not via 0 is required). The contacts pads 114A, 114B, 114T and passivation layer 116 may be part of a die-level back end of the line (BEOL) build-up structure 112, which can be formed using traditional back-end semiconductor processing techniques, including damascene processes for interconnections. In an embodiment, the contact pads 114A, 114B, 114T are aluminum pads, though other materials may be used, such as copper, etc. The metal layers within the package-level RDL 130 may also be formed using suitable materials such as aluminum and copper.

Figure 2:
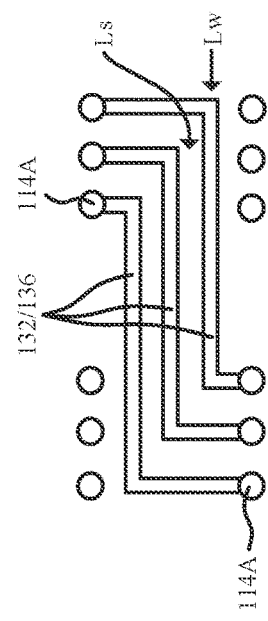
FIG. 2 is a top plan view illustration of a plurality of die-to-die interconnects in accordance with an embodiment.

FIG. 2 is a top plan view illustration of a plurality of die-to-die interconnects in accordance with an embodiment. In the particular embodiment illustrated, the die-to-die interconnect routing 132 and interconnect lines 136 may have an S-shape between adjacent rows connecting tow dies 110. In this manner, contact pads 114A nearest a die 110 edge 111 may be connected to contact pads 114A further away from the die 100 edge 111 of a connected die 100. Similarly, contact pads 114A furthers a die 110 edge 111 may be connected to contact pads 114A nearest from the die edge 111 of a connected die 100. Furthermore, the S-shape routing may connect contact pads 114A from a first row to a second row in the connect dies 110. Thus, the rows may be orthogonal to the die 110 edges 111. Such an S-shape routing may keep wiring lengths approximately the same. However, this is not required, and it is possible for closes contact pads 114A to be connected where short wiring is to be included. In accordance with embodiments, the specific processing techniques utilized may be able to achieve a wiring density of the die-to-die interconnects 132 in which the line widths of the interconnect lines 136 have a line width (Lw) of less than 1 µm and spacing between (Ls) of less than 1 µm. Line width and spacing may be attributed partly to damascene fabrication sequences which may be akin to more traditional BEOL processing. Line width and spacing may also be attributed to an increased density of the die contact pads 114A, which can be facilitated by adaptive writing with adaptive lithography. In an embodiment, the plurality of contact pads 114A used for die-to-die interconnection can be separated by a pad pitch of less than 5 µm. Contact pads 114B used for intra-die connection can similarly be spaced, or separated by a larger pad pitch. Contact pads 114T (and 114B) used for testing may be separated by the larger pad size and/or pitch in order to accommodate probing.

Figure 3:
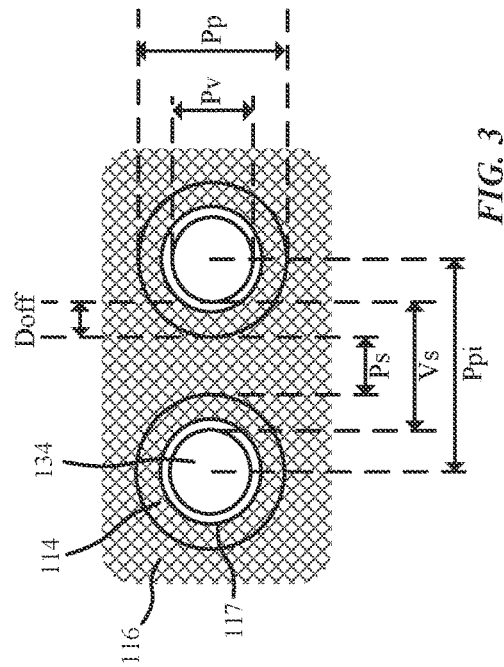
FIG. 3 is a top plan view illustration of die contact pad size, via contact size, and passivation layer opening sizes in accordance with an embodiment.

FIG. 3 is a top plan view illustration of die contact pad 114 size, via 134 contact size, and passivation layer 116 opening 117 sizes in accordance with an embodiment. In particular, FIG. 3 illustrates the relationships that may be achieved using adaptive wiring with adaptive lithography. As previously described, in a traditional package structure based on die face up placement, and without adaptive wiring with adaptive lithography, the relative size of the die contact pad 114 accommodate a relatively large via 0, and additional alignment tolerances associated with die pick and place tools and RDL lithography to contact the passivated via 0. In accordance with embodiments, adaptive lithography facilitates a relatively "enclosure free" arrangement in which the ratio of via 134 contact size to passivation layer 116 opening 117 size can approach 1:1. Furthermore, such a relatively enclosure free arrangement can allow for a reduced offset distance (Doff) separation of the perimeters (Pv) of the plurality of vias 134 from perimeters (Pp) of the plurality of contacts pads 114. In an embodiment, the contact pads 114A used for die-to-die interconnects 132 of the package 100 are separated by a mean minimum offset distance (Doff) of less than 3 microns. Such an enclosure free arrangement, and removal of via 0, can further allow for reduced size of the contact pads 114, and hence higher density. In an embodiment, the contact pads 114A used for die-to-die interconnects 132 of the package 100 are separated by a pad pitch (Ppi) of less than 5 µm. This may further correspond to a pad spacing (Ps) between contact pads of less than 1 µm. Via 134 spacing (Vs) between adjacent vias 134 may be less than 2 µm assuming a 2-3 µm wide via 134.

Figure 4:
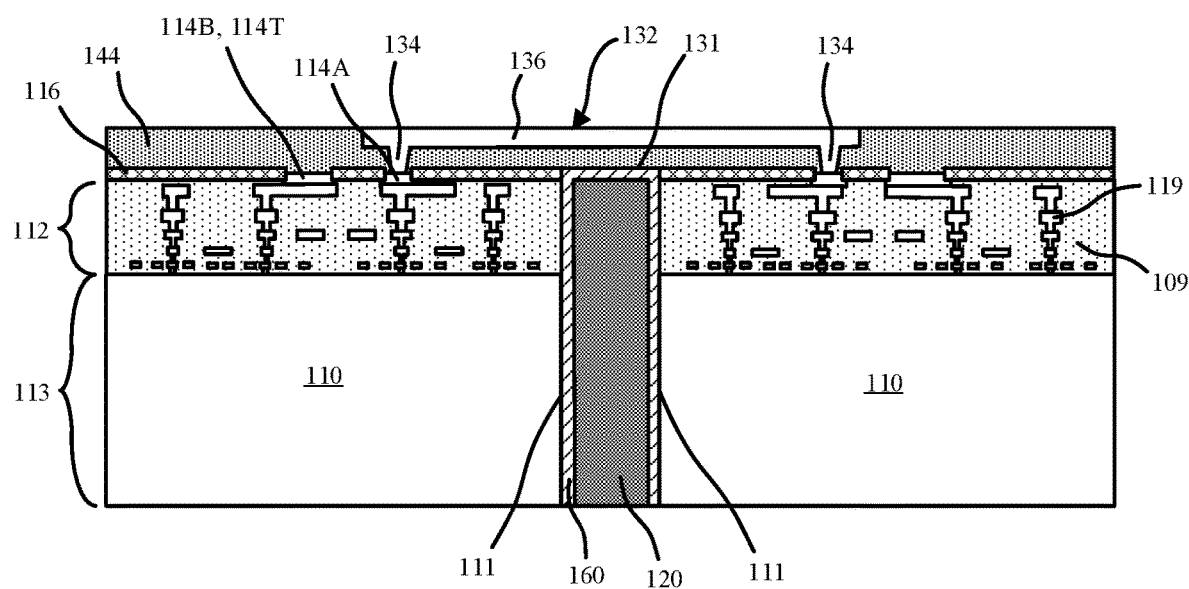
FIG. 4 is a schematic close-up cross-sectional side view illustration of a package-level redistribution layer including a dual damascene die-to-die interconnect formed over an inorganic barrier layer liner in accordance with an embodiment.

Referring now to FIG. 4, with reference also to FIG. 1, it has been observed that when forming such fine die-to-die interconnect 132 wiring that stress induced from the molding compound layer 120 can adversely affect the metal layers forming the die-to-die interconnects 132, particularly in the lower metal layers, and be a limiting factor on wiring density. It has also been observed that mold pits (e.g. voids) in the molding compound layer can create a topography that can be transferred to subsequently formed die-to-die interconnects, also potentially limiting wiring density. FIG. 4 is a schematic close-up cross-sectional side view illustration of a package-level redistribution layer including a dual damascene die-to-die interconnect 132 formed over an inorganic barrier layer 160 liner. FIG. 4 also provides a close up view of dies 110. As shown, each die 110 may include active devices formed in a semiconductor substrate layer 113 such as silicon. A BEOL build-up structure 112 is then at least partially fabricated up to contact pads 114A, 114B, 114T. Such a BEOL build-up structure is primarily for wiring within each die 110. The BEOL build-up structure 112 may include dielectric layers 109 formed of variety of suitable materials common to back-end interlayer dielectric (ILD) such as silicon dioxide, organosilica films for low-k dielectrics, polymers, etc. In an embodiment, the BEOL build-up structure 112 includes inorganic dielectric layers 109. The BEOL build-up structure 112 may additionally include metal wiring layers 119 formed using common to back-end processing such as single damascene and dual damascene processing. Exemplary materials include copper and aluminum. Other materials layers may be present as common practice including seed layers, barrier layers, etch stop layers, etc.

In accordance with embodiments a conformal inorganic barrier layer 160 liner can be deposited on the die set, prior to the molding compound layer 120. The inorganic barrier layer 160 may extend laterally between sidewalls 111 of the dies 110. Furthermore, the package-level RDL 130 top side 131 may be formed directly on the inorganic barrier layer 160 and span directly over the inorganic barrier layer 160 laterally between the dies 110 in the die set. In accordance with embodiments, the inorganic barrier layer 160 may be formed of suitable materials such as silicon nitride, or other nitrides, carbides, oxides, or even appropriate metal. Additionally, the inorganic barrier layer 160 may act as a barrier to outgassing form the molding compound layer 120, and reduce pitting within the dielectric layers 144 of the package-level RDL 130. For example, pitting can be attributed to an uneven surface of the molding compound layer 120 after curing, or surface roughness attributed to surface tension of the molding compound organic materials along surfaces of filler particles within the molding compound layer 120. The outgassing reduction, and planarity also enable more traditional BEOL-type die-to-die interconnect formation.

Figure 5:
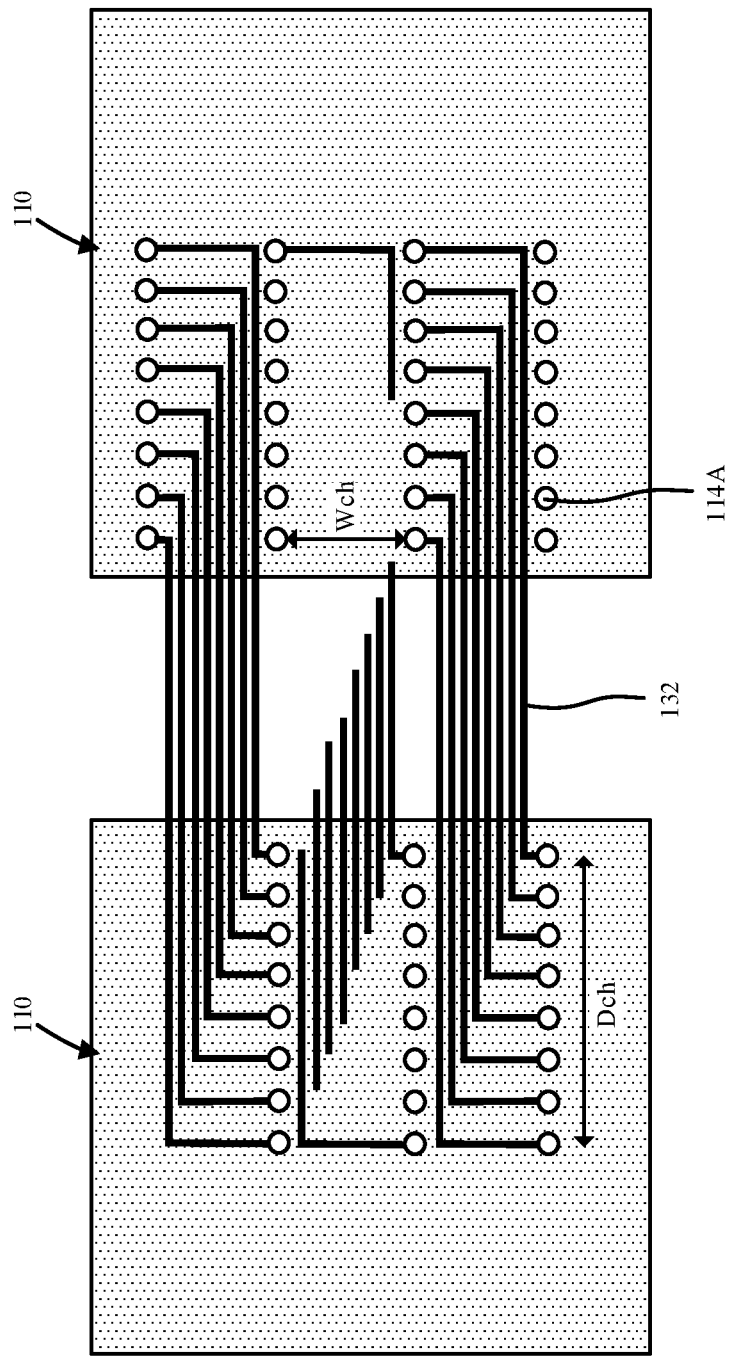
FIG. 5 is a top plan view illustration of a plurality of die-to-die interconnects showing channel width and channel depth in accordance with an embodiment.

Referring now to FIG. 5 a top plan view illustration is provided for plurality of die-to-die interconnects 132 showing channel width (Wch) and channel depth (Dch) in accordance with an embodiment. In particular, embodiments described herein can support increased contact pad 114A density and die-to-die interconnect 132 density. Such increased density, can either reduce channel depth (Dch) and channel width (Wch) or increase the contact pad 114A density in the channel depth (Dch) and the contact pad 114A spacing and wiring density in the channel width (Wch). Thus, the packaging sequences described in accordance with embodiments may be scaled to support high bandwidth applications with extremely high input/output (IO).

Figure 6:
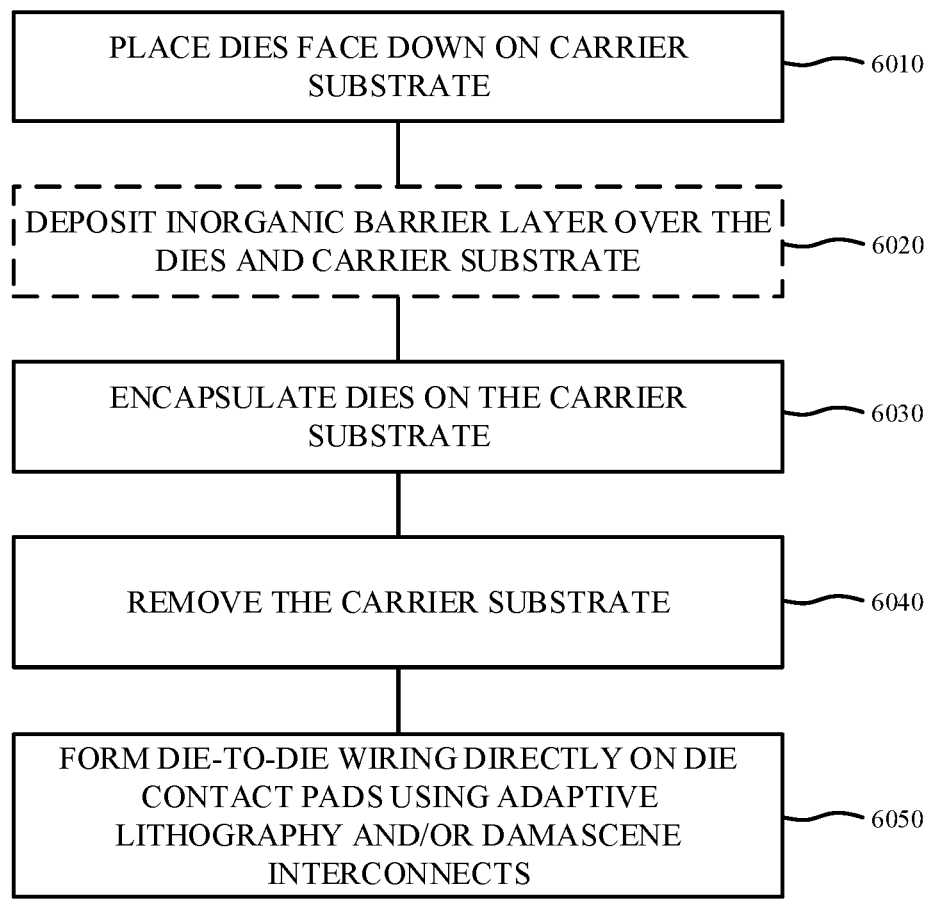
FIG. 6 is a flow diagram for a method of a package in accordance with an embodiment.

FIG. 6 is a flow diagram for a method of a package in accordance with an embodiment. FIGS. 7A-7H are schematic cross-sectional side view illustrations of a method of forming a package in accordance with an embodiment. In interest of clarity and conciseness, the structures and process flow of FIGS. 6 and 7A-7H are described together in the following description.

Figure 7A:
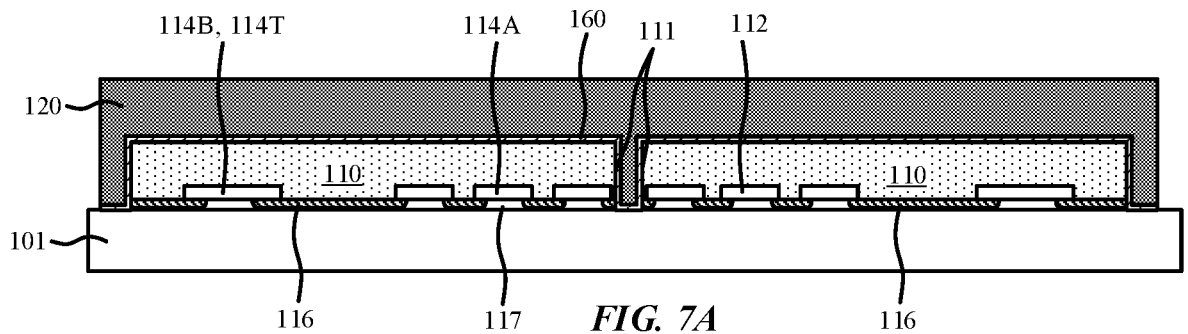
FIGS. 7A-7H are schematic cross-sectional side view illustrations of a method of forming package in accordance with an embodiment.

As shown in FIG. 7A at operation 6010 a die set is placed face down on a carrier substrate 101. The carrier substrate 101 may be any suitable rigid carrier, such as a silicon wafer, glass, metal, etc. Specifically, the dies 110 may be placed onto a temporary adhesive layer on the carrier substrate 101. While only a single die set including two dies 110 is illustrated, the die set may include additional dies. Furthermore, an array of die sets may be placed onto the carrier substrate 101 for large scale fabrication of an array of packages. As previously described, each die 110 may include a plurality of contact pads 114A, 114B, 114T and passivation layer 116 with openings 117 exposing the plurality of contact pads 114A, 114B, 114T.

Figure 7B:
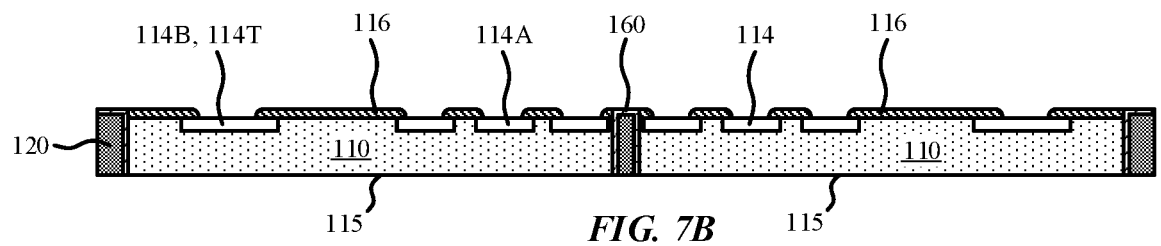
Figure 7C:
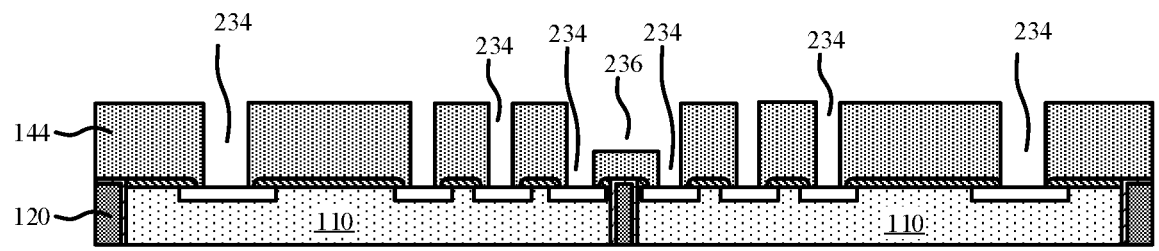
Figure 7D:
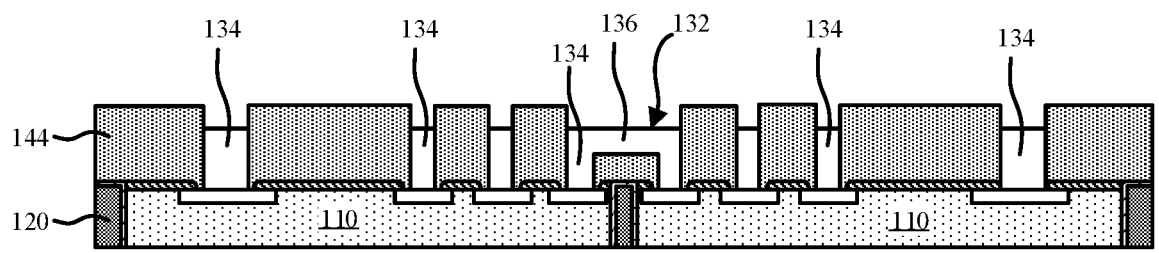

In inorganic barrier layer 160 may then optionally be deposited over the back sides of the dies 110 and on the carrier substrate 101 between the dies 110 at operation 6020. As shown, the inorganic barrier layer 160 may be a conformal thin film along the exposed surface, including die 110 sidewalls 111, formed of a material such as silicon nitride, or other nitride, carbide, oxide, or metal. The dies 110 may then be encapsulated at operation 6030 where a molding compound layer 120 is formed over and between the dies 110. At this point, the overmolded die sets may be polished/ground to reduce the thickness of the molded structure. In an embodiment, such a grinding operation may remove the molding compound layer 120 and inorganic barrier layer 160 from the back sides 115 of the dies 110. This may facilitate total z-height reduction, reduce the amount of mold induced stress with a smaller molding compound volume, and possibly improve thermal properties for heat exchange at the back sides 115 of the dies 110. The carrier substrate may then be removed at operation 6040 as shown in FIG. 7B. At this point the back side of the reconstituted structure including the back sides 115 of the dies 110 may optionally be attached to a second carrier substrate for additional processing.

The package-level RDL 130 including die-to-die wiring is then formed directly on the die contact pads 114A, 114B at operation 6050 using combinations of the various techniques described herein such as adaptive lithography and/or damascene interconnects. Referring now to the embodiment illustrated in FIG. 7C a dielectric layer 144 is deposited over front side of the die sets and patterned. In the particular embodiment illustrated the dielectric layer 144 is patterned to form a via openings 234 and damascene structures including via openings 234 and trench openings 236. The dielectric layer 144 may be formed of a variety of suitable materials common to back-end interlayer dielectric (ILD) such as silicon dioxide, organosilica films for low-k dielectrics, polymers, etc. In some embodiments multiple dielectric layers 144 and intervening etch stop layers may be utilized to form a dual damascene structure. In a particular embodiment, the dielectric layer 144 is formed of a photoimageable polymer such as photoimageable polyimide (PI). In such an embodiment, the damascene via opening 234 and trench openings 236 can be formed by developing permanent areas of the plurality of photoimageable polymer layers followed by dissolving undeveloped areas of the photoimageable polymer layers. More specifically, the permanent areas are exposed to light through a mask, then developed to undergo crosslinking, becoming less soluble than the unexposed regions to the solvent. The remining via openings 234 and trench openings 236 can then be filled with an electrically conductive material, such as copper using a suitable technique such as plating, resulting in the structure illustrated in FIG. 7D including dual damascene die-to-die interconnects 132 and vias 134. As such a single plating step can be used to form the damascene vias and trenches, with the damascene via 134 and the damascene interconnect line 136 (trench) as a continuous metal layer.

Figure 7E:
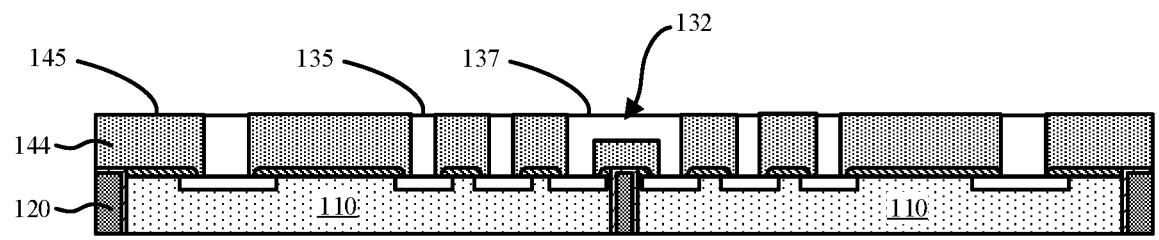
Figure 7F:
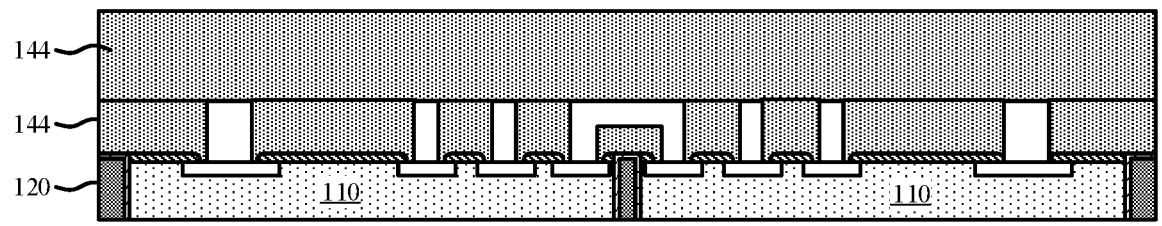
Figure 7G:
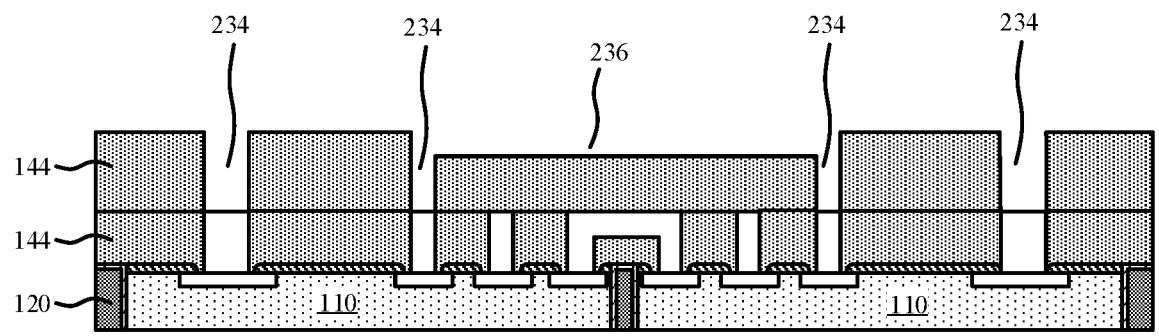
Figure 7H:
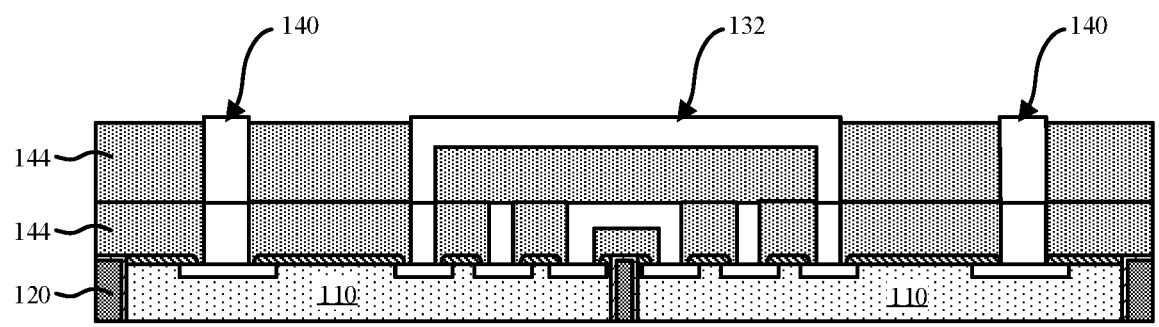

Following addition of the electrically conductive material, the growth surface may be planarized as shown in FIG. 7E to form a planar top surface along across the dielectric layer 144 top surface 145, and exposed via 134 top surfaces 135 and interconnect line 136 top surfaces 137. The sequence of FIG. 7C-7E can then be repeated for multiple dielectric layers 144 and metal layers as shown in FIGS. 7F-7H until the package-level RDL 130 is formed. This may be followed by ball drop of solder bumps 170 and singulation into multiple packages 100. With such planarization methods multiple levels of damascene package-level RDL 130 can be achieved without being limited by the topography of underlying thin films as is used in more traditional RDL technology. In this manner, more wiring layers can be formed, with higher density. Furthermore, when combined with adaptive wiring and adaptive lithography, via pitch density is primarily determined by lithography limits, resulting in high yield, high density die-to-die interconnects 132.

Up until this point, various fabrication sequences have been described with regard to forming die-to-die interconnects between discrete dies 110 after being placed onto a carrier substrate. The adaptive writing and adaptive patterning techniques can also be utilized for die stitching of die areas at the wafer scale prior to singulation, and during the final phases of the BEOL die-level build-up structure fabrication sequence. Thus, such techniques can be utilized to form die area-to-die area interconnects of die area sets within the same chip, or same silicon layer. Furthermore, such techniques can also integrate custom seal ring structures for the die area sets. In this aspect different die area sets can be carved out during wafer dicing. Furthermore, such die stitching may be utilized to fabricate die area sets within a single chip that are larger than a single reticle size.

Figure 8A:
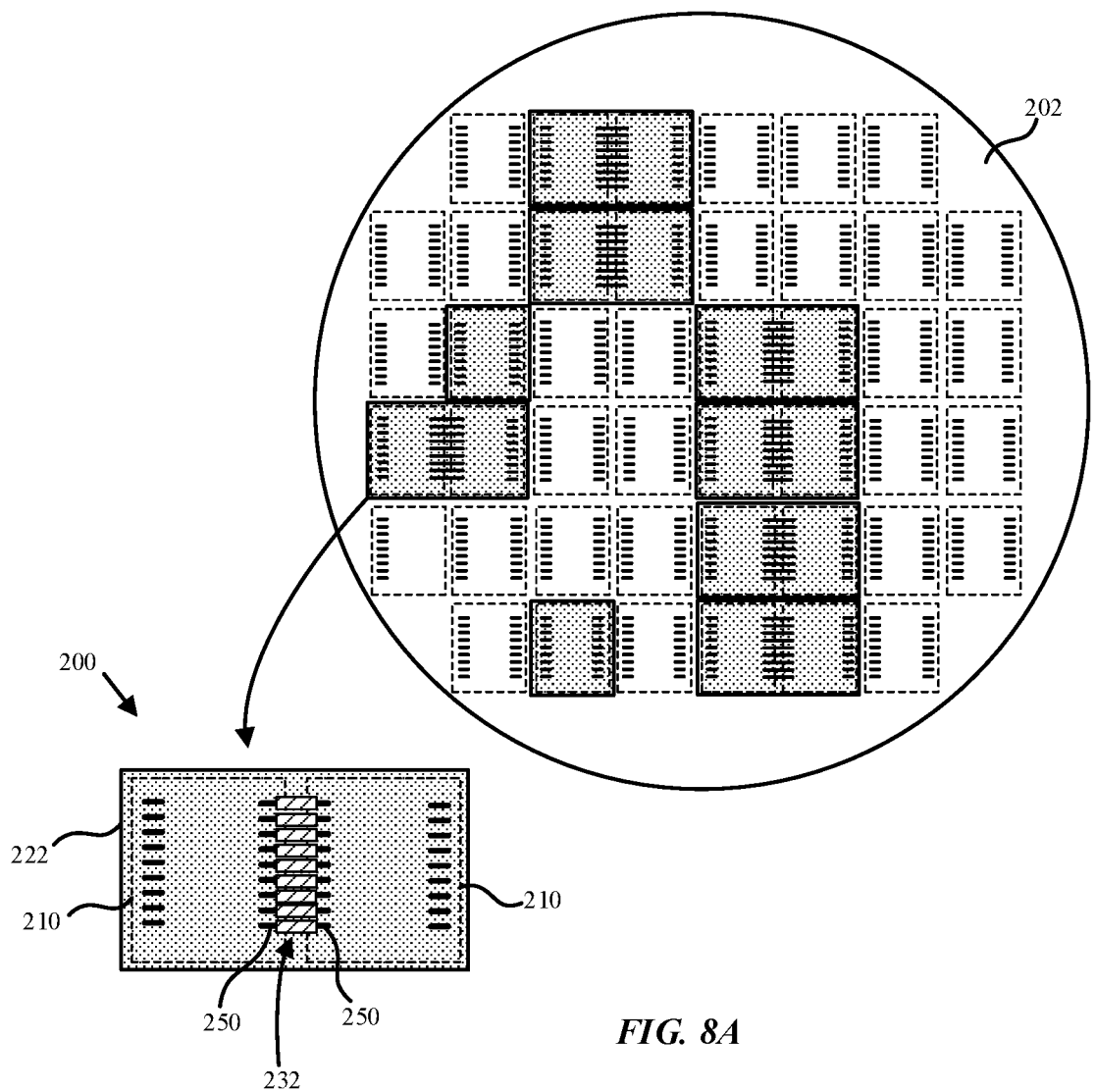
FIG. 8A is a schematic top view illustration of a wafer including an array of die areas in accordance with an embodiment with custom die area-to-die area interconnects.
Figure 8B:
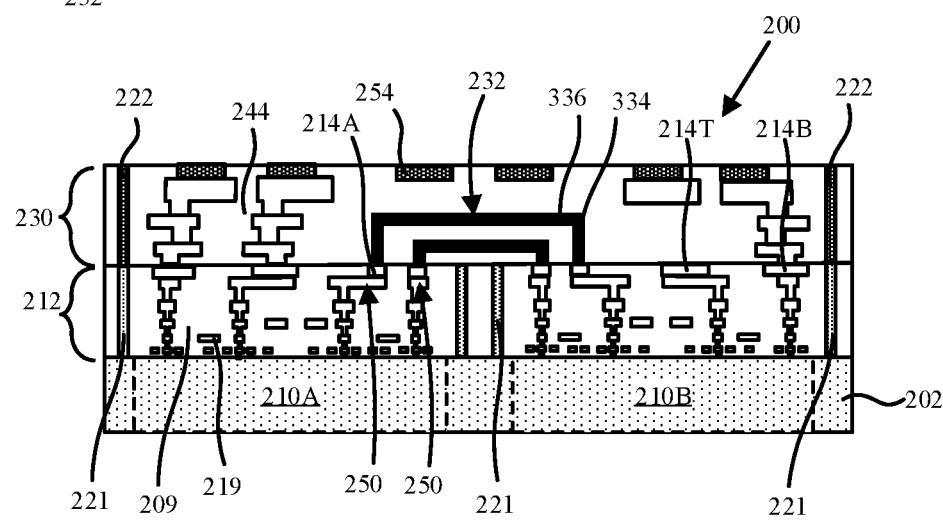
FIG. 8B is a schematic cross-sectional view illustration of a chip including a die area set with stitched die area-to-die area interconnects in accordance with an embodiment.
Figure 8C:
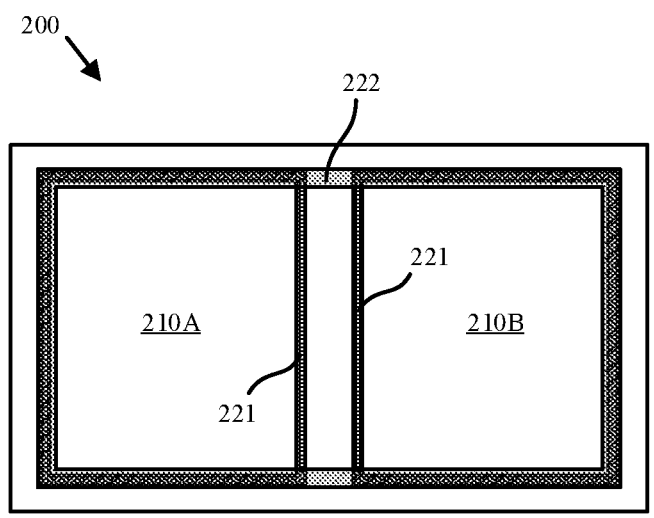
FIG. 8C is a schematic top view illustration of an upper metallic seal that overlies outer perimeters of lower metallic seals of stitched die areas in accordance with an embodiment.

Referring now to FIG. 8A a schematic top view illustration is provided of a semiconductor substrate 202 (e.g. silicon wafer) including an array of die areas 210 in accordance with an embodiment with custom die area-to-die area interconnects 232. FIG. 8B is a schematic cross-sectional view illustration of a chip including a die area set with stitched die area-to-die area interconnects 232 in accordance with an embodiment. FIG. 8C is a schematic top view illustration of an upper metallic seal that overlies outer perimeters of lower metallic seals of stitched die areas in accordance with an embodiment. Similar to the discussion of die-to-die interconnect 132 routing with regard to FIG. 1, the die area-to-die area interconnect 232 routing physically and electrically connects the adjacent die areas 210, which can be formed in the same semiconductor substrate 202. In this instance, the upper metallic seals 222 can also be selectively formed around peripheries of the die areas 210 for each die set of one or more die areas 210. Thus, the upper metallic seals 222 in are not completed with the reticles used to form die areas 210. Instead, the upper metallic seals 222 may be formed during the fabrication sequence used to form the die area-to-die area interconnect 232 routing. Here the contact pad density can be very tight, as the placement accuracy is well controlled due to lithographic control, as opposed to pick and place limitations. Also, a planar, solid surface provides an environment conducive to fine wiring density.

As shown, a chip 200 with stitched die area-to-die area interconnect 232 may include a semiconductor substrate 202 (e.g. silicon wafer) including a first die area 210A and a second die area 210B separate from the first die area 210A. A back-end-of-the-line (BEOL) build-up structure 212 spans over the first die area 210A and the second die area 210B. In an embodiment, the BEOL build-up structure 212 includes a first lower metallic seal 221 over (and outside) a first peripheral area of the first die area 210A, a second lower metallic seal 221 over (and outside) a second peripheral area of the second die area 210B. For example, the first and second lower metallic seals 221 may be seal rings. The BEOL build-up structure 212 may additionally include a plurality of contact pads 214A, 214B, 214T, similar to contact pads 114A, 114B, 114T previously described, which may be electrically connected to the first and second die areas 210A, 210B and optionally the lower metallic seals 221. The BEOL build-up structure 212 additionally includes dielectric layers 209 and wiring layers 219 similar to those described with BEOL build-up structure 112. Lower metallic seals 221 may be formed of the same materials.

The die areas 210A, 210B in accordance with embodiments can include active areas, including core logic circuits, die-to-die input/output circuits, etc. Die routing 250 may be formed within the BEOL build-up structure 212 and connected to the die-to-die input/output circuits. Referring to FIG. 8A in particular the die routing 250 is prefabricated along one or more sides of the die areas 210. In the illustrated embodiment, the die routing 250 is formed along two opposite sides, though this is exemplary, and the die routing 250 may be formed along any and all sides of the die areas 210 for stitching with any adjacent die area 210.

In accordance with embodiments, the die areas 210 may be tested prior to forming a chip-level RDL 230 in order to determine which die area sets are to be stitched together and scribed. Thus, the formation die area-to-die area interconnect 232 routing and selection of scribe/dicing areas is customized around each die area 210. The chip-level RDL 230 may be formed similarly as the package-level RDL 130 previously described, using similar fabrication techniques. For example, dielectric layers 244 may be formed of photoimageable polymer, or other common ILD materials. Likewise, metal layers may be formed of copper, aluminum, etc. and may or may not be damascene. In an embodiment, upper metallic seals 222 are formed along the periphery of the die sets over underlying lower metallic seals 221 within the die areas 210 in a die set. Thus, an upper metallic seal 222 within the chip-level RDL 230 may overly the outer perimeters of the underlying lower metallic seals 221 of underlying BEOL build up structure 212. Thus, as shown in the embodiment illustrated in FIG. 8C an upper metallic seal 222 may not overly portions of the lower metallic seals 221 between adjacent die areas 210 for chip 200.

The chip-level RDL 230 may use different fabrication techniques based on density requirements. For example, a copper damascene and oxide dielectric layer (inorganic) sequence commonly used for BEOL build-up structures may achieve the highest density, along with higher cost. It can be possible to use aluminum damascene and oxide dielectric layer sequence for slightly less density and less cost. Use of copper damascene with photoimageable polymer dielectric layer can further reduce cost, with somewhat less density.

In an embodiment, a chip 200 includes a BEOL build up structure 212 formed using copper damascene interconnects and oxide (inorganic) dielectric layer 209. An overlying chip-level RDL 230 is formed with copper damascene with photoimageable polymer dielectric layer 244. The chip-level RDL 230 includes die area-to-die area interconnects 232 including vias 334 and interconnect line 336 similar as previously described with regard to the die-to-die interconnects 132.

Figure 9:
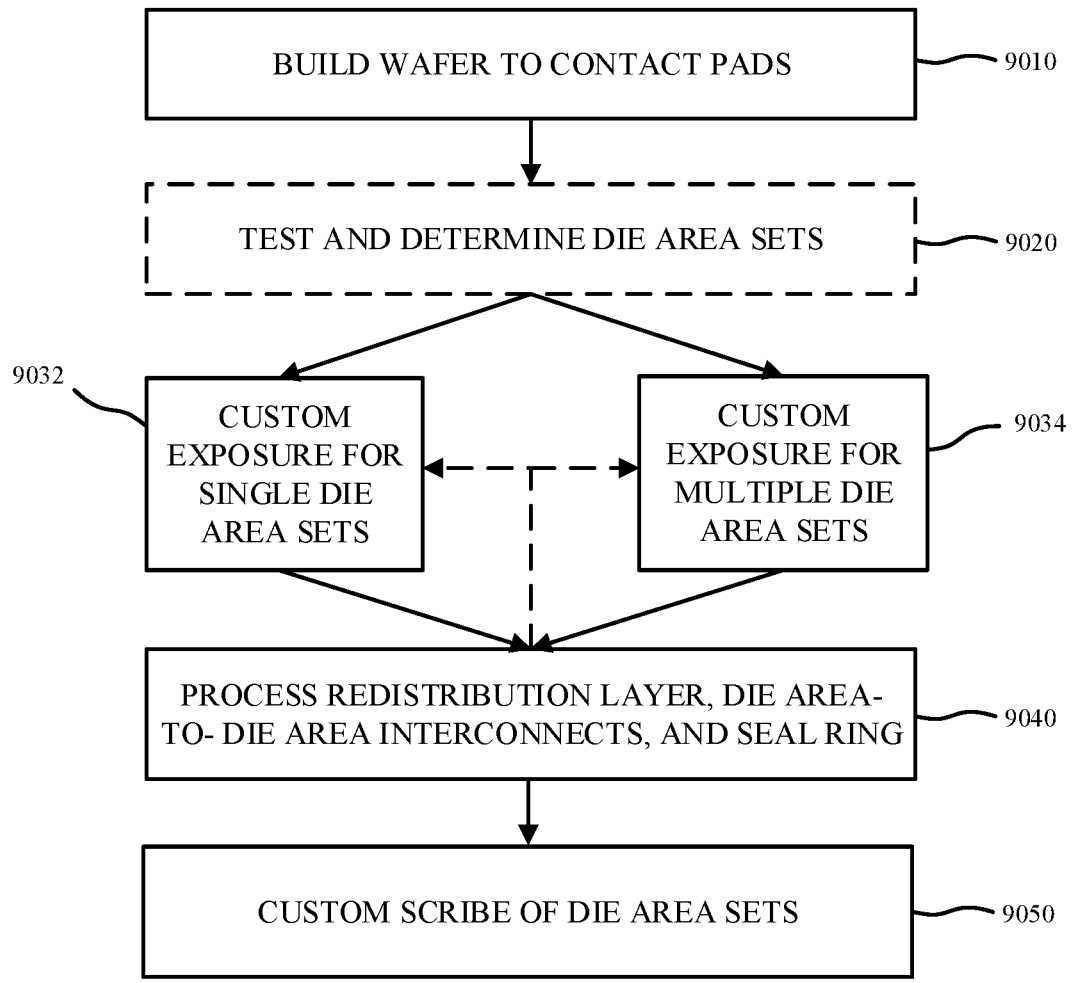
FIG. 9 is a flow chart of a method of forming a stitched die area structure with a custom metallic seal in accordance with an embodiment.

Referring now to FIG. 9, a flow chart is provided of a method of forming a chip 200 with stitched die area structure with a custom metallic seal in accordance with embodiments. At operation 9010 the BEOL build-up structure 212 is partially formed up to contact pads 214. That is, a significant portion of the metal routing is formed, yet processing has not continued to the point of fabricating the landing pads 254, such as underbump metallurgy (UBM) pads. At this stage processing of the metal routing has not yet reached the point for conventional wafer testing methods. At operation 9020 die areas are tested by probing contact pads 214T and binned into die area sets (e.g. identified as good or bad) based on process data. For example, the process data may be based on early electrical test data from front-end-of-the-line (FEOL) and/or early BEOL fabrication stages, optical test data, and yield trends for wafer die location. Data may include electrical test or optical inspection data. For example, electrical test data may include probed (touch) tests to determine electrical quality of transistors or interconnects, simple circuits (e.g. ring oscillator or the like). Probed touchdown testing may be accompanied by subsequent clean/repair operations. No-touch testing may also be utilized to bin the die areas. Exemplary no-touch testing methods include optical inspection, and systematic (e.g. wafer maps) and historical trends, and project yield to identify the die sets. No-touch testing may include radio frequency, or optical probes, or probing on a remote area with test signals propagated to the die area under test.

Based on this information, custom exposures are performed at operations 9032 and 9034 for singe die area sets and multiple die area sets, and processing is continued at operation 9040 to process the chip-level RDL 230, die area-to-die area interconnects 232 and upper metallic seals 222. This sequence is then repeated until the chip-level RDL 230 is completed. Custom scribing can then be performed to scribe chips 200 with specified die area sets at operation 9050.

Figure 10:
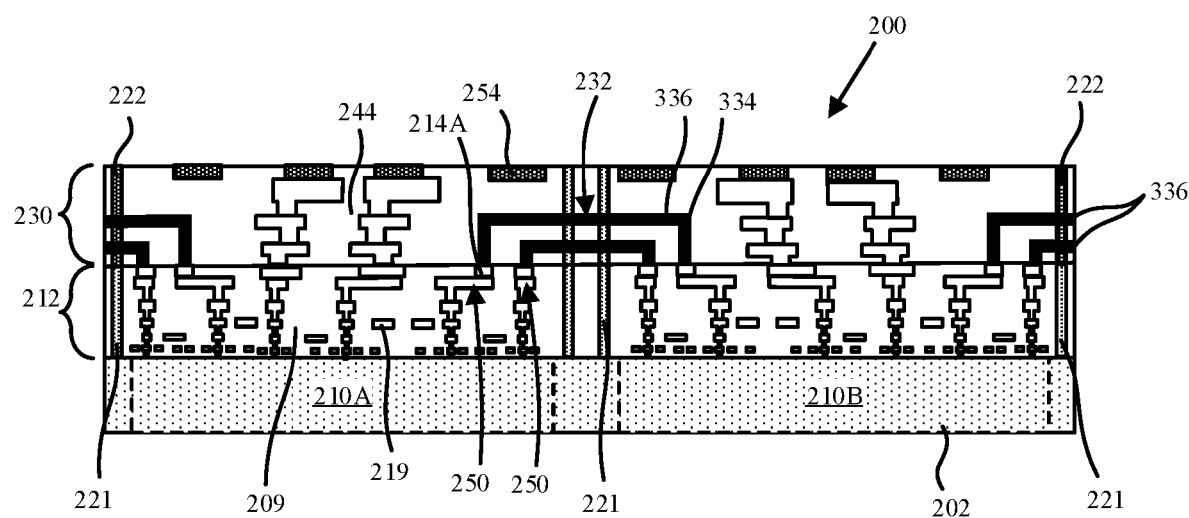
FIG. 10 is a schematic cross-sectional view illustration of a chip including a die area set with stitched die area-to-die area interconnects and scribed die area-to-die area interconnects in accordance with an embodiment.

In an alternative sequence the chip-level RDL 230, die-to-die interconnects 232 and seal rings can be processed prior to testing and determining die area sets, which is then followed by scribing of die area sets. In such a fabrication sequence, scribing may include cutting through die-to-die interconnects 232 along one or more sides of some chips 200 as shown in FIG. 10. Thus, one or more scribed edges of the chips 200 (i.e. side surface of the chip-level RDL) may include exposed interconnect lines 336. In such a fabrication sequence, the interconnect lines 232 may be formed through the upper metallic seals 222, or the upper metallic seals 222 may be partially formed around the edges of the chips 200 to accommodate the interconnect lines 232.

In utilizing the various aspects of the embodiments, it would become apparent to one skilled in the art that combinations or variations of the above embodiments are possible for forming a package with fine die-to-die routing. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A package comprising:
a die set encapsulated in a molding compound layer;
a package-level redistribution layer (RDL) spanning across the die set and the molding compound layer and on and in electrical connection with the die set;
wherein each die in the die set includes a die-level back end of the line (BEOL) build-up structure including a plurality of contact pads, a passivation layer, and a plurality of openings in the passivation layer exposing the plurality of contact pads; and
wherein the package-level RDL includes a plurality of die-to-die interconnects connecting the plurality of contact pads between each die and embedded within a plurality of vias and trenches formed in a plurality of photoimageable organic dielectric layers, the plurality of vias including a group of vias formed directly on the plurality of contact pads for each die in the die set, wherein each via has a perimeter that is smaller than a corresponding opening in the passivation layer that exposes a corresponding contact pad which the via is directly formed on.

2. The package of claim 1, wherein the plurality of die-to-die interconnects comprise damascene interconnects, and the BEOL build-up structure for each die in the die set includes damascene metal wiring layers.

3. The package of claim 2, wherein the damascene interconnects comprise copper damascene interconnects.

4. The package of claim 2, wherein the damascene interconnects include multi-layer damascene interconnects including damascene interconnect lines within multiple metal layers in the package-level RDL.

5. The package of claim 2, wherein the group of vias formed directly on the plurality of contact pads for each die in the die set are a same height.

6. The package of claim 2, wherein the damascene interconnects include a first die-to-die interconnect that includes a first damascene via directly on a first contact pad of a first die, a second damascene via directly on a second contact pad of a second die, and a damascene interconnect line connecting the first damascene via and the second damascene via, wherein the first damascene via, the second damascene via and the damascene interconnect line are a continuous metal layer.

7. The package of claim 2, wherein perimeters of the group plurality of vias are separated from perimeters of the plurality of contacts pads by a mean minimum offset distance of less than 3 microns.

8. The package of claim 2, wherein:
the die set includes a first die and a second die; and
the package-level RDL includes first intra-die interconnections for the first die and second intra-die interconnections for the second die.

9. The package of claim 2, wherein the BEOL build-up structure for each die includes plurality of test contact pads, wherein the package-level RDL is not electrically connected to the test contact pads for each die.

10. The package of claim 9, wherein the plurality of contact pads is a plurality of aluminum pads.

11. The package of claim 1, wherein:
the package-level RDL includes a plurality of vias formed directly on the plurality of contact pads for each die in the die set; and
perimeters of the plurality of vias are separated from perimeters of the plurality of contacts pads by a mean minimum offset distance of less than 3 microns.

12. The package of claim 11, wherein:
the die set includes a first die and a second die;
the plurality of vias includes a first via directly on a first contact pad of the first die, and a second via directly on a second contact pad of the second die; and
a dual damascene die-to-die interconnect that includes a first damascene via directly on the first via, second damascene via directly on the second via, and a damascene interconnect line connecting the first damascene via and the second damascene via, wherein the first damascene via, the second damascene via and the damascene interconnect line are a continuous metal layer.

13. The package of claim 1:
further comprising an inorganic barrier layer over the die set, and between the die set and the molding compound layer; and
wherein the package-level RDL spans over the inorganic barrier layer laterally between dies in the die set.

14. The package of claim 13, wherein the plurality of die-to-die interconnects comprise a first dual damascene die-to-die interconnect that includes:
a first damascene via connected to a first contact pad of a first die, a second damascene via connected to a second contact pad of a second die, and a damascene interconnect line connecting the first damascene via and the second damascene via, wherein the first damascene via, the second damascene via and the damascene interconnect line are a continuous metal layer, and wherein the damascene interconnect line spans directly over the inorganic barrier layer laterally between the first die and the second die.

15. The package of claim 1, wherein the plurality of contact pads for each die are separated by a pad pitch of less than 5 μm.

16. The package of claim 15, wherein the plurality of die-to-die interconnects includes side-by-side interconnect lines with a line width of less than 1 μm and spacing between of less than 1 μm.

17. A package comprising:
a die set encapsulated in a molding compound layer;
an inorganic barrier layer over the die set, and between the die set and the molding compound layer;
a package-level redistribution layer (RDL) spanning across the molding compound layer and on and in electrical connection with the die set;
wherein the package-level RDL spans across the inorganic barrier layer laterally between dies in the die set;
wherein each die in the die set includes a die-level back end of the line (BEOL) build-up structure including a plurality of contact pads; and
wherein the package-level RDL includes a plurality of die-to-die interconnects connecting the plurality of contact pads between each die.

18. The package of claim 17, wherein the package-level RDL includes an organic dielectric layer spanning across the die set, and a plurality of vias extending through the organic dielectric layer and directly on a plurality of contact pads for each die in the die set.

19. The package of claim 18, wherein perimeters of the plurality of vias are separated from perimeters of the plurality of contacts pads by a mean minimum offset distance of less than 3 microns.

20. The package of claim 18, wherein the plurality of vias are part of damascene interconnects.

21. The package of claim 20, wherein the damascene interconnects in include damascene interconnect lines connecting the plurality of vias between plurality of contact pads for each die in the die set, and the damascene interconnect lines are directly over the inorganic barrier layer laterally between the die set.

22. A method comprising:
placing a die set face down on a carrier substrate, each die in the die set includes a die-level back end of the line (BEOL) build-up structure including a plurality of contact pads, a passivation layer, and a plurality of openings in the passivation layer exposing the plurality of contact pads;
encapsulating the die set in a molding compound;
removing the carrier substrate;
measuring a location of the die set;
comparing the measured location of the die set to a baseline location, and determining a modified wiring pattern; and
forming a package-level redistribution layer (RDL) over the die set based on the modified wiring pattern to form a plurality of die-to-die interconnects in a plurality of photoimageable polymer layers by developing permanent areas of the plurality of photoimageable polymer layers followed by dissolving undeveloped areas of the photoimageable polymer layers;
wherein package-level RDL spans across the die set and the molding compound layer and is on and-in electrical connection with the die set, and the plurality of die-to-die interconnects connects the plurality of contact pads between each die and is embedded within a plurality of vias and trenches formed in the plurality of photoimageable organic dielectric layers, the plurality of vias including a group of vias formed directly on the plurality of contact pads for each die in the die set, wherein each via has a perimeter that is smaller than a corresponding opening in the passivation layer that exposes a corresponding contact pad which the via is directly formed on.

23. The method of claim 22, further comprising depositing an inorganic barrier layer liner over the die set and the carrier substrate prior to encapsulating the die set in the molding compound.

24. The method of claim 23, wherein the package-level RDL comprises forming dual damascene die-to-die interconnects.

25. A chip comprising:
a die area set formed in a same semiconductor layer;
a back end of the line (BEOL) build-up structure formed over the die area set, the BEOL build-up structure including a plurality of contact pads;
a chip-level redistribution layer (RDL) spanning across the BEOL build-up structure and over the die area set;
wherein the chip-level RDL includes a plurality of die area-to-die area interconnects connecting the plurality of contact pads between each die area; and
wherein the BEOL build-up structure includes a plurality of lower metallic seals, each lower metallic seal around a corresponding die area, and the chip level-RDL includes an upper metallic seal that overlies outer perimeters of the plurality of lower metallic seals.

26. The chip of claim 25, wherein the plurality of die area-to-die area interconnects is embedded within one or more photoimageable organic dielectric layers.

27. The chip of claim 26, wherein the back end of the line (BEOL) build-up structure includes a plurality of wiring layers formed in inorganic dielectric layers.

28. The chip of claim 25, wherein the plurality of die-to-die interconnects are formed before testing, and further comprising a side surface of the chip-level RDL including a plurality of cut interconnect lines.

* * * * *